United States Patent

Gardner et al.

Patent Number: 5,930,632
Date of Patent: Jul. 27, 1999

[54] PROCESS OF FABRICATING A SEMICONDUCTOR DEVICE HAVING COBALT NIOBATE GATE ELECTRODE STRUCTURE

[75] Inventors: Mark I. Gardner, Cedar Creek; Mark C. Gilmer, Austin, both of Tex.

[73] Assignee: Advanced Micro Devices, Austin, Tex.

[21] Appl. No.: 08/980,916

[22] Filed: Dec. 1, 1997

[51] Int. Cl.$^6$ .................................................. H01L 21/336
[52] U.S. Cl. ................................................................ 438/287
[58] Field of Search ............................ 438/287, 288, 438/289, 142, 151, 758

[56] References Cited

PUBLICATIONS

Chang, D.D.; Ling, H.C. "The effects of dopants on the electrical resistivity in lead magnesiom niobate multilayer capacitors." IEEE Trans. on Components, Hybrids and Man'f. Tech., vol. 12, No. 2, pp. 310–315. Abstract Only, Jun. 1989.

*Primary Examiner*—Charles Bowers
*Assistant Examiner*—Craig Thompson
*Attorney, Agent, or Firm*—Merchant, Gould, Smith, Edell, Welter & Schmidt, P.A.

[57] ABSTRACT

A semiconductor device having a cobalt niobate-cobalt silicide gate electrode structure is provided. A semiconductor device, consistent with one embodiment of the invention, is formed by forming a cobalt niobate gate insulating layer over the substrate and forming a cobalt silicide layer over the cobalt niobate layer. The cobalt silicide layer and cobalt niobate gate insulating layer may, for example, be selectively removed to form at least one cobalt silicide-cobalt niobate gate electrode structure. The cobalt niobate-cobalt silicide gate electrode structure can, for example, increase the operating speed of the device as compared to conventional transistors.

13 Claims, 3 Drawing Sheets

PROCESS OF FABRICATING A SEMICONDUCTOR DEVICE HAVING COBALT NIOBATE GATE ELECTRODE STRUCTURE

FIELD OF THE INVENTION

The present invention is generally directed to semiconductor devices and, more particularly, to a semiconductor device having a cobalt niobate-metal silicide gate electrode structure.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily-doped source/drain regions 105 are formed in the semiconductor substrate 101 and are connected to source/drain terminals (not shown). The source/drain regions 105 may, for example, be lightly-doped drain (LDD) source/drain regions as shown. As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

Semiconductor devices, like the one described above, are used in large numbers to construct most modern electronic devices. As a larger number of such devices are integrated into a single silicon wafer, improved performance and capabilities of electronic devices can be achieved. Device performance can be further improved by increasing the operating speeds and reliability of the transistors on a device. Accordingly, improvements to transistor structures (e.g., source and drains, gate electrode, gate insulating layer) are continually sought in order to increase the operating speeds and reliability of the transistors.

SUMMARY OF THE INVENTION

The present invention provides a semiconductor device having a cobalt niobate-metal silicide gate electrode structure and a process of fabricating such a device. The cobalt niobate-metal silicide gate electrode structure can, for example, increase the operating speed of the device as compared to conventional transistors.

A process of fabricating a semiconductor device, consistent with one embodiment of the invention, includes forming a cobalt niobate gate insulating layer over the substrate and forming a gate electrode layer over the cobalt niobate layer. The gate electrode layer may, for example, be a cobalt silicide layer. The cobalt silicide layer and cobalt niobate gate insulating layer may, for example, be selectively removed to form at least one cobalt silicide-cobalt niobate gate electrode structure.

The cobalt silicide layer may, for example, be formed by depositing cobalt silicide onto the cobalt niobate layer. Alternatively, the cobalt silicide layer may, for example, be formed by forming a polysilicon layer over the cobalt niobate layer, forming a cobalt layer over the polysilicon layer, and reacting the cobalt with the polysilicon layer to form the cobalt silicide layer.

A semiconductor device, consistent with an embodiment of the invention, includes a substrate and a gate electrode structure disposed over the substrate. The gate electrode structure includes a cobalt niobate gate insulating layer and a gate electrode disposed over the cobalt niobate layer. The gate electrode layer may, for example, be a cobalt silicide layer.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
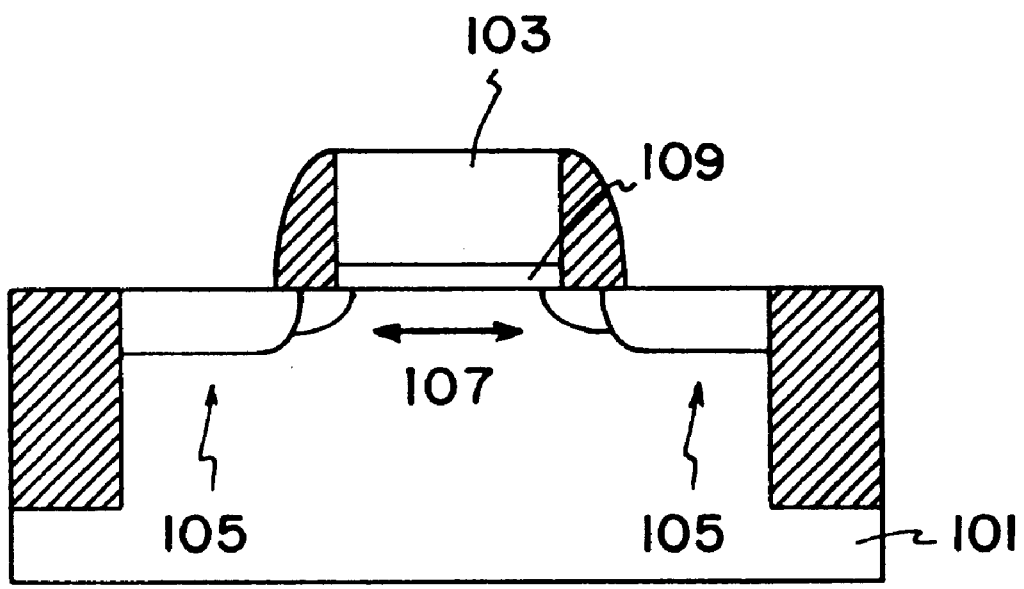
FIG. 1 illustrates a conventional MOS transistor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention generally relates to semiconductor devices including, for example, MOS, CMOS, and Bi-CMOS devices, having gate electrode structures. The term gate electrode structure is used herein to describe a structure including a gate electrode and a gate insulating layer. While the present invention is not so limited, details of the present invention will be illustrated through the discussion which follows.

FIGS. 2A–2D illustrate an exemplary process for forming a semiconductor device having a cobalt niobate-cobalt silicide gate electrode structure. In accordance with this embodiment, a layer of cobalt niobate 203 is formed over a substrate 201. The substrate 201 is typically a silicon substrate. The cobalt niobate ($CoNb_2O_6$) layer 203 may be formed using, for example, well-known sputtering or plasma vapor deposition (PVD) techniques.

The cobalt niobate layer 203 will be used to insulate a gate electrode from the substrate 201. The thickness of the cobalt niobate layer 203 is suitably selected in consideration of the desired separation of the gate electrode from the substrate 201, taking into account the permittivity of the cobalt niobate. Cobalt niobate advantageously has a higher permittivity (i.e., dielectric constant, k) than the silicon dioxide normally used to form the gate insulating layers of conventional transistors. The permittivity of cobalt niobate is about 18–33, while silicon dioxide has a permittivity of about 4. Suitable cobalt niobate gate insulating layer 205 thicknesses range from about 100–400 Å for many applications. For these thicknesses, the cobalt niobate gate insulating layer (assuming a dielectric constant of 32) has an equivalent silicon dioxide thickness of about 12.5 to 25 Å(i.e., 100–400 Å of the cobalt niobate has the equivalent capacitive characteristics as about 12.5 to 25 Å of silicon dioxide).

A layer of cobalt silicide 205 is formed over the cobalt niobate layer 203. The cobalt silicide layer 205 may be formed using a number of different techniques. In this particular embodiment, the cobalt silicide layer 205 is formed by sputtering or plasma vapor depositing cobalt silicide. The cobalt silicide will be used as the gate electrode for the transistor. The thickness of the cobalt silicide layer 205 is suitably selected in consideration of the desired thickness of the gate electrode. Suitable thicknesses for the cobalt silicide layer 205 range from about 1000 to 3000 Å for many applications. The use of cobalt silicide is provided by way of example not of limitation. Other metal silicides, such as titanium silicide and tungsten silicide may, for example, be alternatively used.

As illustrated by arrows 206, an optional implant of a fluorine-bearing species may be performed to incorporate fluorine at the interface between the cobalt niobate layer 203 and the substrate 201. Suitable fluorine bearing species include, for example, $F_2$ or F. The implant energy and dosage of the fluorine bearing species is selected in consideration of the desired penetration of the fluorine bearing species. Typically, it is desired that the fluorine bearing species is implanted such that as a result of the implant (as well as subsequent heat treatment) fluorine is incorporated at the gate insulating layer 203 and substrate 201 interface. Suitable implant energies and dosages range from about 100 to 300 KeV and about 5E13 to 5E14 atoms/$cm^2$ for many applications. The fluorine implant can improve device performance and reliability by, for example, reducing hot carrier injection effects. In alternate embodiments, a fluorine implant into the cobalt niobate layer 203 may be performed before forming the cobalt silicide layer 205 or after forming a gate electrode structure.

Figure 2A:
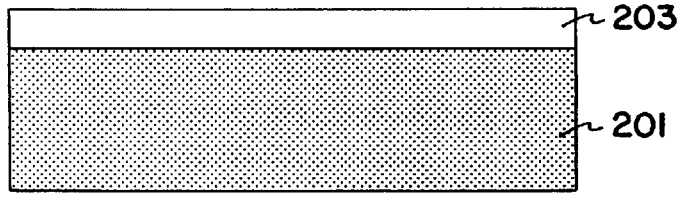
FIGS. 2A–2D illustrate an exemplary process in accordance with one embodiment of the invention.
Figure 2B:
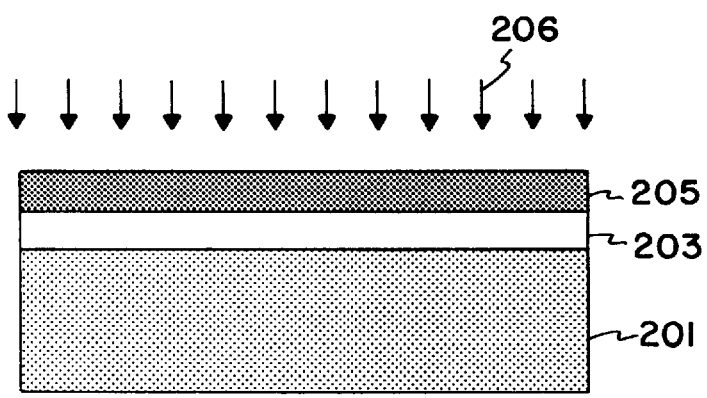
Figure 2C:
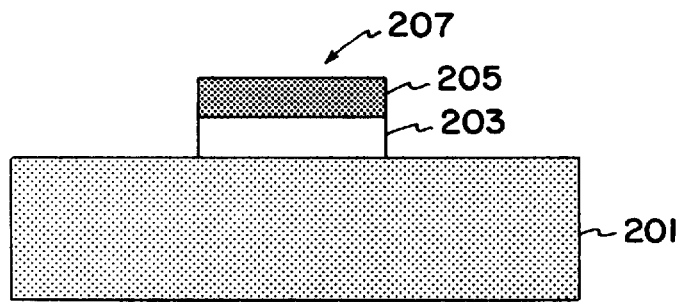

Portions of the cobalt silicide layer 205 and cobalt niobate layer 203 are removed to form a gate electrode structure 207, as illustrated in FIG. 2C. The gate electrode structure 207 generally includes a gate electrode 209 formed from the cobalt silicide layer 205 and a gate insulating layer, which insulates the gate electrode from the substrate 201, formed from the cobalt niobate layer 203. Removal of portions of the cobalt silicide layer 205 and cobalt niobate layer 203 may be done using, for example, well-known photolithography and etching techniques.

After forming the gate electrode structure 207, fabrication may continue with conventional processing steps including, for example, source/drain formation, silicidation, interconnect formation and so forth. The formation of lightly-doped drain (LDD) source/drain structures is illustrated by way of example in FIG. 2D. To form the LDD structures 209, a low dose of a dopant is implanted into the substrate 201 using the gate electrode structure 207 for alignment. This implant is used to form lightly-doped regions 211. The type of dopant (e.g., p-type or n-type) typically depends on the type of device being formed (e.g., NMOS or PMOS). Suitable n-type dopants include arsenic and phosphorous, while suitable p-type dopants include boron, for example. Following the LDD implant, spacers 213 are formed on sidewalls of the gate electrode structure 207. Using the spacers 213 for alignment, a source/drain implant of a similar dopant is performed to form heavily-doped regions 215 in the substrate 201. Together the heavily-doped regions 215 and lightly-doped regions 211 form the LDD structures 209.

Figure 3A:
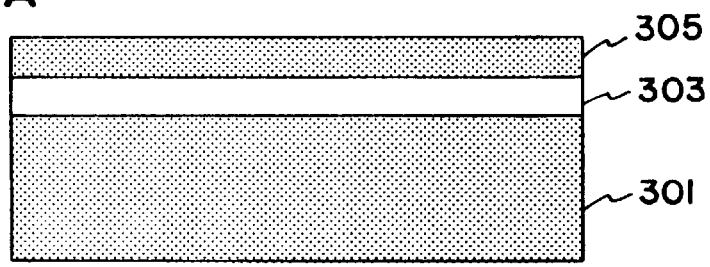
FIGS. 3A–3D illustrate an exemplary process in accordance with another embodiment of the invention.

FIGS. 3A–3D illustrate another exemplary process for forming a cobalt niobate-cobalt silicide gate electrode structure. The use of cobalt silicide is provided by way of example not limitation. As noted above, other metal silicides may be used in place of cobalt silicide. In accordance with this exemplary process, a cobalt niobate layer 303 is formed over a substrate 301. The cobalt niobate layer 303 may, for example, be formed in a similar manner as the cobalt niobate layer 203 discussed above. A layer of polysilicon 305 is then formed over the cobalt niobate layer 303. The resultant structure is illustrated in FIG. 3A.

The polysilicon layer 305 will be reacted with cobalt in order to form a cobalt silicide layer over the cobalt niobate layer 303. The thickness of the polysilicon layer 305 is selected in consideration of the desired thickness of the cobalt silicide layer, taking into account the consumption rate of polysilicon during the reaction process. Typically, it is desired that all of the polysilicon layer 305 is consumed during the cobalt silicide reaction process. Suitable thicknesses of the polysilicon layer 305 range from about 300 to 600 Å, and preferably about 500 Å.

Figure 3B:
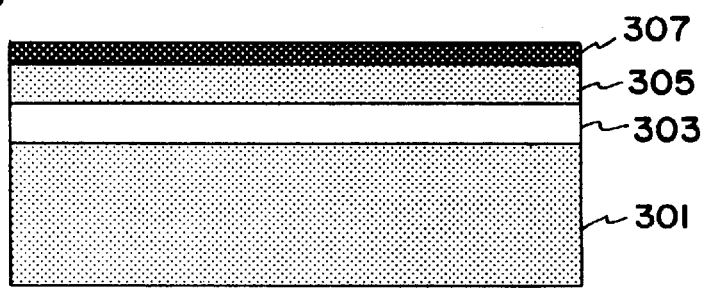

A layer of cobalt 307 is formed over the polysilicon layer 305, as illustrated in FIG. 3B. The cobalt layer 307 may be formed using, for example, well-known deposition techniques. As noted above, the cobalt layer 307 will be reacted with the underlying polysilicon layer 305 to form a cobalt silicide layer over the cobalt niobate layer 303. The thickness of the cobalt layer 307 is typically selected to consume all of the polysilicon layer 305 during the cobalt silicide reaction. Depending on the application, the entire cobalt layer 307 may or may not be consumed during the cobalt silicide reaction. During a cobalt silicide reaction, approximately 2.0 units of polysilicon are consumed for every unit of cobalt. Suitable thicknesses for the cobalt layer 307 range from about 100 to 200 Å for many applications.

Figure 3C:
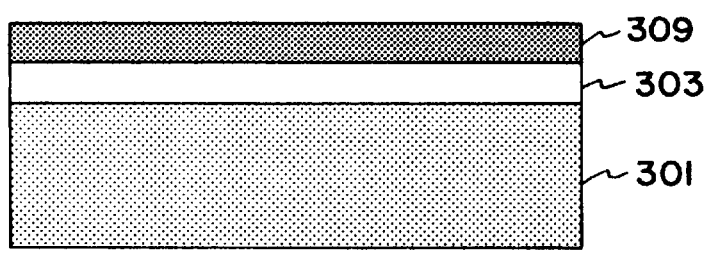

The polysilicon layer 305 and cobalt layer 307 are reacted to form a cobalt silicide layer 309, as illustrated in FIG. 3C. After the cobalt silicide layer 309 is formed, any unreacted portions of the cobalt layer 307 may be removed using, for example, well-known etching techniques. In alternate embodiments, unreacted portion of the cobalt layer may be left in tact, providing a cobalt layer on top of the cobalt silicide layer. In a process consuming 300 to 600 Å of polycilicon, approximately 350 to 700 Å of cobalt silicide is formed.

The characteristics (e.g., time and temperature) of the cobalt silicide reaction process can vary depending on the particular application (e.g., the equipment used, etc.). In one exemplary process, the cobalt silicide reaction is performed by annealing the substrate at a temperature of about 700° C. for about 30 to 60 seconds. This forms a cobalt silicide layer. Unreacted portions of the cobalt are removed, and a final anneal at about 800° C. is performed. The final anneal serves to lower the resistivity of the cobalt silicide layer.

At this point, an optional implant of a fluorine-bearing species may be performed to incorporate fluorine at the interface between the cobalt niobate layer 303 and the substrate 301. The fluorine implant may be performed in a similar manner as discussed above. In alternate embodiments, a fluorine implant into the cobalt silicide layer 303 may be performed before forming the cobalt silicide layer 305 or after forming a gate electrode structure.

Figure 2D:
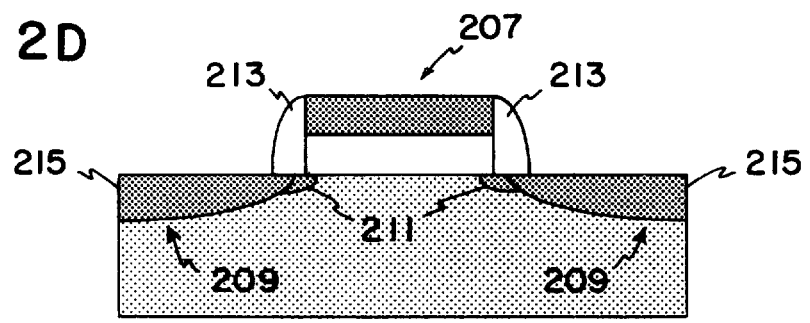
Figure 3D:
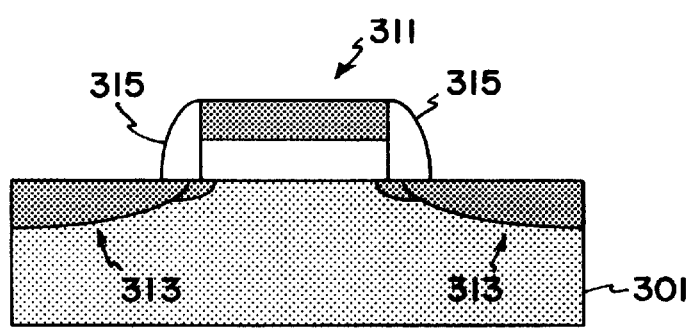

Portions of the cobalt silicide layer 309 and underlying cobalt niobate layer 303 are removed (e.g., by etching) to form one or more gate electrode structures 311 over the substrate 301. Source/drain regions, such as LDD source/drain structures 313, may be formed using the gate electrode structure 311 and sidewall spacers 315. Formation of the gate electrode structure 311, spacers 315 as well as the LDD source/drain structures 313 may be formed in a similar manner as discussed above with respect to FIGS. 3C and 3D above. While LDD source/drain structures are illustrated in FIGS. 2D and 3D, it is noted that the invention is not so limited. Many different types of source/drain structures fall within the scope of the present invention.

Using the above processes, a cobalt niobate-cobalt silicide gate electrode structure may be formed. This provides enhanced device performance. For example, the use of a cobalt niobate gate insulating layer allows the equivalent thickness of the gate insulating layer to be reduced as compared to conventional insulating layers utilizing silicon dioxide. Moreover, the use of a cobalt silicide as the gate electrode enhances device performance by, for example, increasing the conductivity of the gate electrode as compared to conventional gate electrodes. By using cobalt silicide as the gate electrode, the possibility of the formation of a depletion layer at the gate electrode/gate insulating layer interface is avoided.

As noted above, the present invention is applicable to the fabrication of a number of different devices in which the benefits of a cobalt niobate-metal silicide gate electrode structure are desirable. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A process of forming a semiconductor device, comprising:

forming a cobalt niobate gate insulating layer over a substrate; and forming a gate electrode layer over the cobalt niobate gate insulating layer.

2. The process of claim 1, wherein the gate electrode layer is a cobalt silicide layer.

3. The process of claim 2, wherein forming the cobalt silicide layer includes depositing a layer of cobalt silicide over the cobalt niobate gate insulating layer.

4. The process of claim 2, wherein forming the cobalt silicide layer includes:

forming a layer of polysilicon over the cobalt niobate gate insulating layer;

forming a layer of cobalt over the polysilicon layer; and reacting the polysilicon layer with the cobalt layer to form the cobalt silicide layer.

5. The process of claim 4, wherein reacting the polysilicon layer with the cobalt layer includes consuming all of the polysilicon layer.

6. The process of claim 4, further including removing unreacted portions of the cobalt layer after the cobalt-polysilicon reaction.

7. The process of claim 4, wherein reacting the polysilicon layer with the cobalt layer to form the cobalt silicide layer includes leaving a remaining portion of the cobalt layer over the cobalt silicide layer.

8. The process of claim 2, wherein the cobalt niobate gate insulating layer has a thickness ranging from about 100 to 400 Å.

9. The process of claim 2, wherein the cobalt silicide layer has a thickness ranging from about 1,000 to 3,000 Å.

10. The process of claim 2, further including removing portions of the cobalt niobate gate insulating layer and the cobalt silicide gate electrode layer to form a cobalt niobate-cobalt silicide gate electrode structure.

11. The process of claim 1, further including implanting a fluorine bearing species into the cobalt niobate layer to incorporate fluorine at an interface of the cobalt niobate layer and the substrate.

12. The process of claim 1, wherein the fluorine bearing species is implanted after forming the gate electrode layer.

13. The process of claim 1, wherein the fluorine bearing species is implanted before forming the gate electrode layer.

* * * * *